United States Patent
Kim et al.

(10) Patent No.: US 8,976,328 B2
(45) Date of Patent: Mar. 10, 2015

(54) LIQUID CRYSTAL DISPLAY DEVICE AND METHOD FOR FABRICATING THE SAME

(71) Applicant: LG Display Co., Ltd., Seoul (KR)

(72) Inventors: Jin-Tae Kim, Gyeonggi-do (KR); Myung-Woo Nam, Gyeongbuk (KR); Seung-Mok Shin, Daegu (KR); Soo-Jeong Choi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 13/728,144

(22) Filed: Dec. 27, 2012

(65) Prior Publication Data
US 2013/0222723 A1   Aug. 29, 2013

(30) Foreign Application Priority Data

Feb. 27, 2012   (KR) .......................... 10-2012-0019514

(51) Int. Cl.
*G02F 1/1343*   (2006.01)
*H01L 33/58*   (2010.01)
(Continued)

(52) U.S. Cl.
CPC .......... *H01L 33/58* (2013.01); *G02F 1/136227* (2013.01); *G02F 1/136209* (2013.01); *G02F 1/13394* (2013.01); *G02F 1/134363* (2013.01);
(Continued)

(58) Field of Classification Search
CPC .............. G02F 1/133514; G02F 2001/136222; G02F 1/13394
USPC ........................................... 349/43, 106, 141
See application file for complete search history.

(56) References Cited

U.S. PATENT DOCUMENTS

2001/0026344 A1 * 10/2001 Sakamoto ..................... 349/141
2002/0140891 A1   10/2002 Tomioka et al.
2003/0025857 A1   2/2003 Ochiai et al.
(Continued)

FOREIGN PATENT DOCUMENTS

KR   1020020070756 A   9/2002
KR   1020030011692 A   11/2003
(Continued)

OTHER PUBLICATIONS

Office Action dated Apr. 30, 2014 from the Korean Patent Office in counterpart Korean application No. 10-2012-0019514.
(Continued)

*Primary Examiner* — Lucy Chien
(74) *Attorney, Agent, or Firm* — Morgan, Lewis & Bockius LLP

(57) ABSTRACT

A liquid crystal display device includes a first substrate having a thin film transistor (TFT) in each pixel region, a first inorganic protective film on the first substrate including the TFT, color filters on the first inorganic protective film in each pixel region excluding the TFT, a common electrode on the color filters, a second protective film over the entire first inorganic protective film including the common electrode, a pixel electrode on the second inorganic protective film with the pixel electrode connected to a drain electrode of the TFT exposed by selective removal of the first and second inorganic protective films, the pixel electrode forming a fringe field with the common electrode such that the second inorganic protective film is interposed between the pixel electrode and the common electrode, and a column spacer on the second inorganic protective film with the column spacer covering the TFT.

6 Claims, 7 Drawing Sheets

(51) Int. Cl.
*G02F 1/1362* (2006.01)
*G02F 1/1339* (2006.01)

(52) U.S. Cl.
CPC ............... *G02F 2001/13398* (2013.01); *G02F 2001/136222* (2013.01)
USPC .............................. 349/141; 349/43; 349/106

(56) References Cited

U.S. PATENT DOCUMENTS

| | | | |
|---|---|---|---|
| 2005/0117094 A1 | 6/2005 | Kim et al. | |
| 2007/0002209 A1* | 1/2007 | Tai et al. | 349/58 |
| 2007/0171319 A1 | 7/2007 | Fujita et al. | |
| 2011/0216275 A1* | 9/2011 | Lee et al. | 349/106 |

FOREIGN PATENT DOCUMENTS

| | | |
|---|---|---|
| KR | 1020040016571 A | 2/2004 |
| KR | 1020050052802 A | 7/2005 |
| KR | 1020070078389 A | 7/2007 |

OTHER PUBLICATIONS

Office Action dated Nov. 28, 2014 from the Korean Patent Office in counterpart Korean application No. 10-2012-0019514.

* cited by examiner

LIQUID CRYSTAL DISPLAY DEVICE AND METHOD FOR FABRICATING THE SAME

This application claims the benefit of Korean Patent Application No. 10-2012-0019514, filed on Feb. 27, 2012, which is hereby incorporated by reference as if fully set forth herein.

BACKGROUND OF THE INVENTION

1. Field of the Invention

The present invention relates to a liquid crystal display device, and more particularly, to a liquid crystal display device and a method for fabricating the same to reduce a mask process and remove a photo active compound (PAC) and thereby improve productivity.

2. Discussion of the Related Art

With the progress of information-dependent society, the demand for various forms of display devices has increased. To meet such a demand, efforts have recently been made to research flat panel display devices such as liquid crystal displays (LCDs), plasma display panels (PDPs), electro-luminescent displays (ELDs) and vacuum fluorescent displays (VFDs). Some types of such flat panel displays are being practically applied to various appliances for display purposes.

Of these, LCDs are currently the most widely used as substitutes for cathode ray tubes (CRTs) in association with mobile image display devices because LCDs have advantages of superior picture quality, lightness, slimness, and low power consumption. Various applications of LCDs are being developed as not only mobile image display devices such as monitors of notebook computers, but also monitors of TVs and laptop computers receiving broadcast signals and displaying images. Such a liquid crystal display device includes a first substrate provided with a thin film transistor array, a second substrate provided with a color filter array and a liquid crystal layer formed between the first and second substrates. The first substrate includes a plurality of pixel regions defined by gate lines and data lines that cross each other, a plurality of pixel electrodes formed in the respective pixel regions where data signals are supplied, respectively, and a plurality of thin film transistors to respectively drive the pixel electrodes. Also, the second substrate includes a color filter formed in each pixel region, a black matrix to prevent light leakage and a column spacer to maintain a gap between the first substrate and the second substrate.

The representative driving modes that are most commonly used for the liquid crystal display device include a twisted nematic (TN) mode in which liquid crystal directors are aligned to be twisted by 90° and are then controlled through application of a voltage thereto and an in-plane switching mode in which liquid crystals are driven by a horizontal electric field between a pixel electrode and a common electrode aligned in parallel on a substrate.

In particular, in the in-plane switching mode, pixel electrodes and common electrodes are alternately formed in an opening of the thin film transistor substrate and liquid crystal is aligned by a horizontal electric field generated between the pixel electrodes and common electrodes. An in-plane switching mode LCD device has a wide viewing angle, but drawbacks of low aperture ratio and low transmittance. In order to solve these drawbacks, a fringe field switching (FFS) mode LCD device is suggested.

The FFS mode liquid crystal display device includes a common electrode having a single electrode shape formed in a pixel region and a plurality of pixel electrodes having slit shapes formed on the common electrode, or includes a pixel electrode having a single electrode shape and a plurality of common electrodes having slit shapes, thus operating liquid crystal molecules by a fringe field formed between the pixel and common electrodes.

Hereinafter, a method for fabricating a general fringe field switching mode liquid crystal display device will be described with reference to the annexed drawings.

FIG. 1 is a sectional view illustrating a general fringe field switching mode liquid crystal display device. FIGS. 2A to 2E are sectional views illustrating a step of connecting a drain electrode to a pixel electrode in the liquid crystal display device of FIG. 1.

Referring to FIG. 1, the method for fabricating the general fringe field switching mode liquid crystal display device comprises forming gate lines (not shown), gate electrodes 10a, gate pad lower electrodes 10b and data pad lower electrodes 10c on a first substrate 10 using a first mask, and forming a semiconductor layer 13 including an active layer 13a and an ohmic contact layer 13b stacked in this order using a second mask. Also, the method comprises forming source and drain electrodes 14a and 14b, and data lines DL using a third mask, and forming first and second protective films 15a and 15b to cover the source and drain electrodes 14a and 14b.

Also, the second protective film 15b is selectively removed using a fourth mask to expose the first protective film 15a corresponding to the drain electrode 14b, the gate pad lower electrode 10b and the data pad lower electrode 10c. Also, a common electrode 18 is formed on the second protective film 15b using a fifth mask. A third protective film 15c is formed to cover the common electrode 18 and the third protective film 15c is selectively removed using a sixth mask to expose the drain electrode 14b, the gate pad lower electrode 10b and the data pad lower electrode 10c.

Also, a pixel electrode 16a connected to the drain electrode 14b, a gate pad upper electrode 16b connected to the gate pad lower electrode 10b and a data pad upper electrode 16c connected to the data pad lower electrode 10c are formed on the third protective film 15c using a seventh mask. Also, although not shown, a black matrix, R, G and B color filters and column spacers are formed on the second substrate. In order to perform these steps, the general liquid crystal display device is formed using twelve masks in total. Accordingly, the overall process is complicated and fabrication cost is increased.

Meanwhile, the general liquid crystal display device includes a second protective film 15b formed of a photo active compound (PAC) such that the second protective film 15b is interposed between the first and third protective films 15a and 15c, to reduce data load between data lines DL and pixel electrodes 16a and thereby decrease power consumption. In this regard, generally, the second protective film 15b formed of PAC, an organic insulating film, is thicker than the first and third protective films 15a and 15c formed of an inorganic insulating film. For this reason, time required for formation of the second protective film 15b is greater than time required for formation of the first and third protective films 15a and 15c, thus causing a deterioration in yield.

Furthermore, since the organic insulating film and the inorganic insulating film cannot be patterned through the same mask process, in the general liquid crystal display device, the first protective film 15a and the second protective film 15b are sequentially formed, as shown in FIG. 2A. The second protective film 15b is patterned through a fourth mask process to expose the first protective film 15a, as shown in FIG. 2B. Also, a common electrode 18 is formed on the second protective film 15b.

Then, as shown in FIG. 2C, the third protective film 15c is formed such that the third protective film 15c covers the common electrode 18 and the exposed first protective film 15a. As shown in FIG. 2D, the first and third protective films 15a and 15c corresponding to a region where the second protective film 15b is removed, are patterned through a sixth mask process to expose the drain electrode 14b. Also, as shown in FIG. 2E, a pixel electrode 16a connected to the exposed drain electrode 14b is formed on the third protective film 15c.

That is, as described above, the general liquid crystal display device entails a complicated manufacturing process and has a deteriorated yield, since the first and third protective films 15a and 15c, and the second protective film 15b are formed of different materials and thus cannot be simultaneously patterned.

SUMMARY OF THE INVENTION

Accordingly, the present invention is directed to a liquid crystal display device and a method for fabricating the same that substantially obviate one or more problems due to limitations and disadvantages of the related art.

An object of the present invention is to provide a liquid crystal display device having a COT (color filter on TFT) structure fabricated using ten masks and a method for fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display device includes: a first substrate having a plurality of pixel regions defined by a plurality of gate lines and a plurality of data lines crossing each other; a thin film transistor formed in each pixel region; a first inorganic protective film on the first substrate including the thin film transistor; color filters formed on the first inorganic protective film in each pixel region excluding the thin film transistor; a common electrode formed on the color filters; a second protective film formed over the entire surface of the first inorganic protective film including the common electrode; a pixel electrode formed on the second inorganic protective film, such that the pixel electrode is connected to a drain electrode of the thin film transistor exposed by selective removal of the first and second inorganic protective films, the pixel electrode forming a fringe field with the common electrode such that the second inorganic protective film is interposed between the pixel electrode and the common electrode; and a column spacer formed on the second inorganic protective film such that the column spacer covers the thin film transistor.

The liquid crystal display device may further include a second substrate joined to the first substrate, wherein an electrostatic emission plate is formed over the entire surface of the second substrate.

The electrostatic emission plate may be formed of a transparent conductive material selected from TO, ITO, IZO and ITZO.

The column spacer may be formed of a light shielding material.

The light shielding material may be at least one selected from carbon, titanium oxide and a color pigment.

The column spacer may include: a first pattern overlapping the thin film transistor, to compensate a height of the color filters; and a second pattern formed on the first pattern, wherein the second pattern contacts the second substrate and maintains a cell gap between the first substrate and the second substrate.

In another aspect of the present invention, a method for fabricating a liquid crystal display device includes: forming a plurality of gate lines and a plurality of data lines crossing each other via a gate insulating film to define pixel regions on a first substrate and forming thin film transistors connected to the gate lines and the data lines; forming a first inorganic protective film on the first substrate including the thin film transistor; forming color filters on the first inorganic protective film in each pixel region excluding the thin film transistor; forming a common electrode on the color filters; forming a second inorganic protective film on the common electrode, and selectively removing the first and second inorganic protective film to expose a drain electrode of the thin film transistor; forming a pixel electrode connected to the drain electrode on the second inorganic protective film; and forming a column spacer on the second protective film such that the column spacer covers the thin film transistor.

The method may further include: joining the first substrate to second substrate, the second substrate including an electrostatic emission plate on the entire surface thereof.

The electrostatic emission plate may be formed of a transparent conductive material selected from TO, ITO, IZO and ITZO.

The column spacer may be formed of a light shielding material.

The light shielding material may be at least one selected from carbon, titanium oxide and a color pigment.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In general, a liquid crystal display device includes a first substrate and a second substrate that face each other, and a liquid crystal layer having dielectric anisotropy formed between the first and second substrates, wherein the first substrate is provided with thin film transistors (TFTs) and pixel electrodes in pixel regions defined by gate lines and data lines, and the second substrate is provided with color filters. In this case, when the first substrate is joined to the second substrate, light leakage is generated due to misalignment and an aperture ratio may be considerably deteriorated.

Accordingly, the liquid crystal display device according to the present invention has a COT (color filter on TFT) structure in which color filters and thin film transistors are formed on the first substrate. Such a structure is obtained by forming color filters and thin film transistors on the first substrate using ten masks in total, thus simplifying the overall process and reducing fabrication costs. As a result, join margin between the first substrate and the second substrate is reduced and an aperture ratio may thus be improved.

Hereinafter, with reference to the annexed drawings, the liquid crystal display device according to the present invention will be described.

Figure 1:
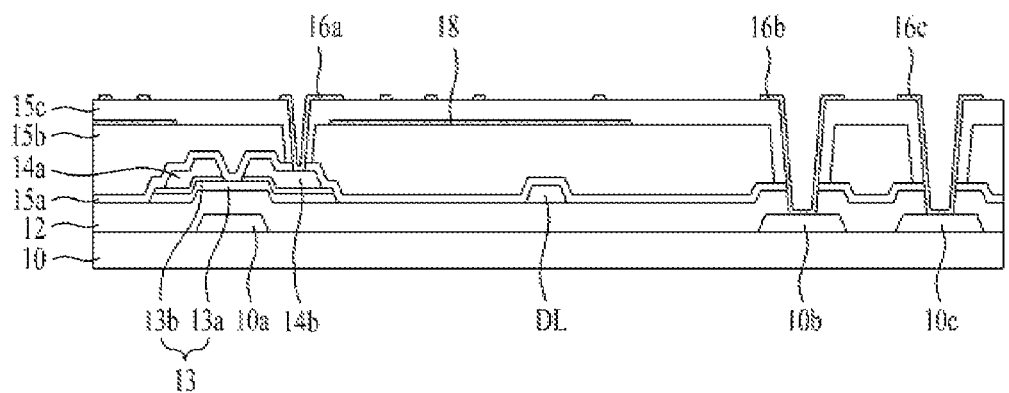
FIG. 1 is a sectional view illustrating a general fringe field switching mode liquid crystal display device.
Figure 2A:
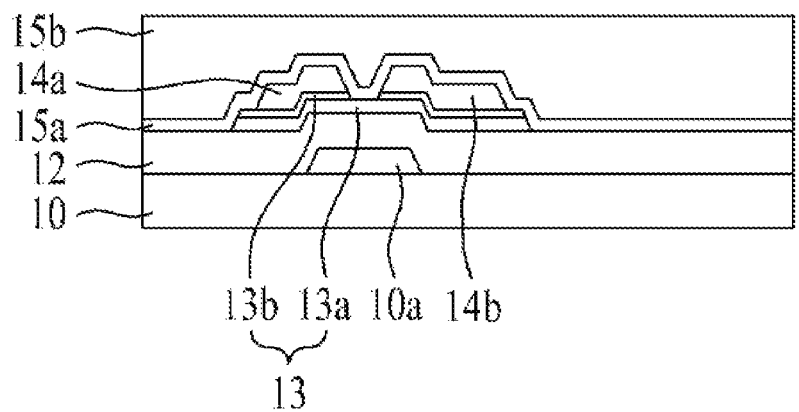
FIGS. 2A to 2E are sectional views illustrating a process of connecting a drain electrode to a pixel electrode in the liquid crystal display device of FIG. 1.
Figure 2B:
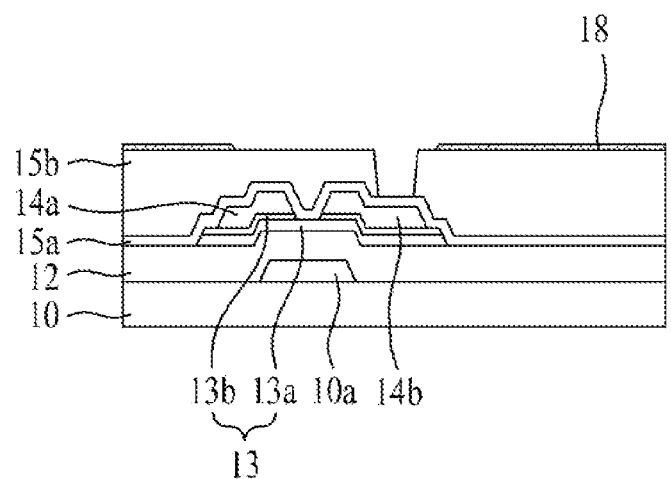
Figure 2C:
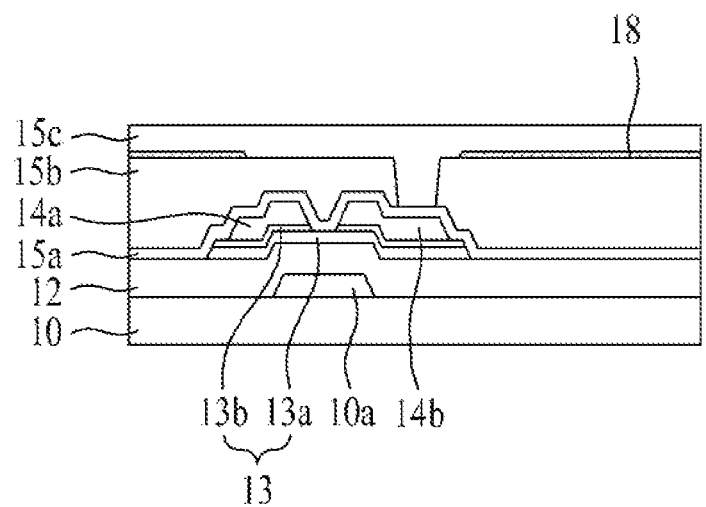
Figure 2D:
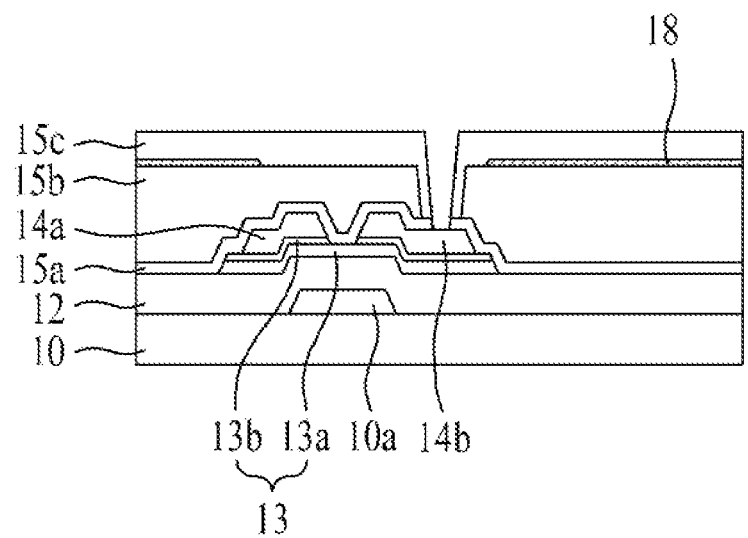
Figure 2E:
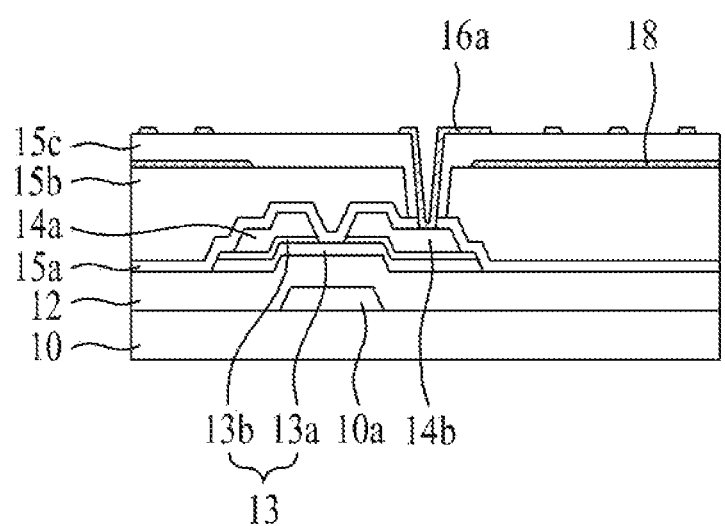
Figure 3:
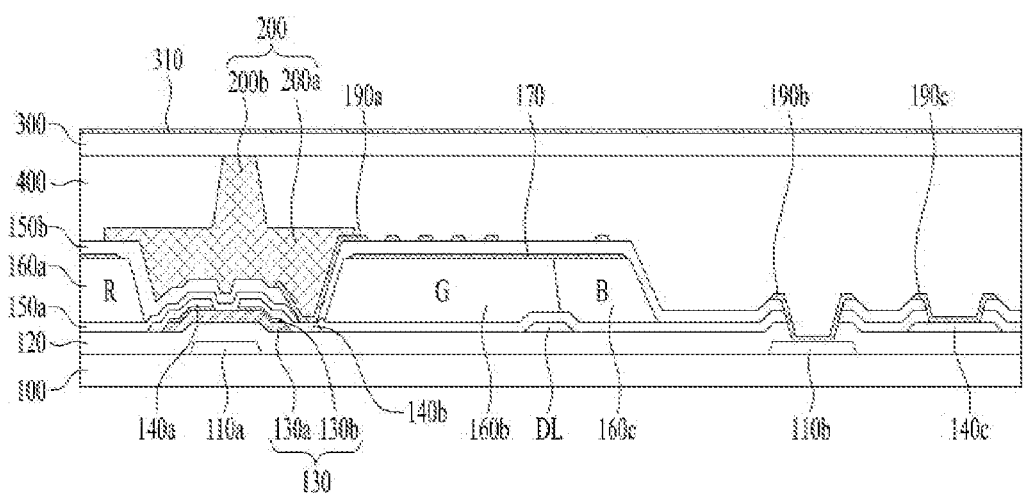
FIG. 3 is a sectional view illustrating a liquid crystal display device according to the present invention.

FIG. 3 is a sectional view illustrating a liquid crystal display device according to the present invention.

As shown in FIG. 3, the liquid crystal display device according to the present invention includes thin film transistors formed in pixel regions defined by gate lines (not shown) and data lines DL that cross each other on the first substrate 100, a first inorganic protective film 150a formed over the entire surface of a gate insulating film 120 including the thin film transistors, R, G and B color filters 160a, 160b and 160c formed in pixel regions excluding the thin film transistors on the first inorganic protective film 150a, a common electrode 170 formed over the R, G and B color filters 160a, 160b and 160c, a second inorganic protective film 150b formed over the entire surface of the first inorganic protective film 150a including the common electrode 170, pixel electrodes 190a formed on the second inorganic protective film 150b such that the pixel electrodes are connected to a drain electrode of the thin film transistors exposed through selective removal of the first and second inorganic protective films 150a and 150b, and form a fringe electric field with the common electrode 170, and column spacers 200 formed on the second protective film 150a such that the column spacers overlap the thin film transistors.

Specifically, a plurality of gate lines (not shown) and data lines DL cross each other on the first substrate 100 to define a plurality of pixel regions, and the thin film transistors are formed at the intersections between the gate lines (not shown) and the data lines DL. Also, the liquid crystal display device includes a gate pad connected to the gate line (not shown) and a data pad connected to the data line DL.

The thin film transistor includes a gate electrode 110a, a source electrode 140a and a drain electrode 140b that are spaced from each other, and a semiconductor layer 130 including an active layer 130a and an ohmic contact layer 130b stacked in this order. The gate electrode 110a may protrude from the gate lines (not shown) to receive a scan signal from the gate lines (not shown) and may be defined by a part of the gate lines (not shown).

The active layer 130a overlaps the gate electrode 110a such that the gate insulating film 120 made of an inorganic insulating material such as silicon oxide (SiOx), silicon nitride (SiNx) is interposed between the active layer 130a and the gate electrode 110a. The ohmic contact layer 130b formed on the active layer 130a reduces contact resistance between the source and drain electrodes (140a, 140b) and the active layer 130a, and the ohmic contact layer 130b corresponding to the gap between the source and drain electrodes 140a and 140b is removed to form a channel.

The source electrode 140a is connected to the data line DL to receive a pixel signal from the data line DL, and the drain electrode 140b faces the source electrode 140a such that the drain electrode 140b is spaced from the source electrode 140a by a predetermined distance. Also, the first inorganic protective film 150a is formed over the gate insulating film 120 including the thin film transistors and the data lines DL. The first inorganic protective film 150a may be formed of an inorganic insulating film such as SiNx and SiOx.

R, G and B color filters 160a, 160b and 160c are formed in pixel regions on the first inorganic protective film 150a. That is, thin film transistors, and R, G and B color filters 160a, 160b and 160c are formed on the first substrate 100, thus minimizing a join margin, when the first substrate 100 is joined to the second substrate 300, thereby improving an aperture ratio.

In particular, as described above, preferably, the R, G and B color filters 160a, 160b and 160c, are formed in pixel regions excluding the thin film transistors, so that the R, G and B color filters do not overlap thin film transistors. This aims at forming a drain contact hole 180a to connect the pixel electrodes 190a to the drain electrode 140b using one mask, based on a configuration in which only the first and second inorganic protective films 150a and 150b overlap the thin film transistors on the drain electrode 140a.

Also, the common electrode 170 is formed of a transparent conductive material such as tin oxide (TO), indium tin oxide (ITO), indium zinc oxide (IZO) and indium tin zinc oxide (ITZO) on the R, G and B color filters 160a, 160b and 160c, and the common electrode 170 having a single electrode shape receives a common signal.

A second inorganic protective film 150b is formed over the entire surface of the first inorganic protective film 150a including the common electrode 170. The second inorganic protective film 150b is also formed of an inorganic insulating film such as SiNx. The first and second inorganic protective films 150a and 150b include a drain contact hole 180a to expose the drain electrode 140b of the thin film transistor.

Also, a plurality of slit-shaped pixel electrodes 190a are formed on the second inorganic protective film 150b and the pixel electrodes 190a are connected to drain electrodes 140b via the drain contact hole 180a. The pixel electrodes 190a are formed of a transparent conductive material such as tin oxide (TO), indium tin oxide (ITO), indium zinc oxide (IZO), and indium tin zinc oxide (ITZO).

In particular, the pixel electrodes 190a form a fringe electric field with the common electrode 170. The second inorganic protective film 150b is interposed between the pixel electrodes 190a and the common electrode 170. Also, liquid crystal molecules are rotated by the fringe field due to dielectric anisotropy, and transmittance of light emitted to pixel regions is changed depending on the rotation level of the liquid crystal molecules, to realize an image.

Also, column spacers 200 are formed on the second inorganic protective film 150b such that they overlap the thin film transistors. As shown in the drawing, the column spacers 200 are formed to have a double height including: a first pattern 200a serving as PAC that overlaps the thin film transistors to compensate heights of the R, G and B color filters 160a, 160b and 160c; and a second pattern 200b formed on the first pattern 200a such that second pattern 200b contacts the second substrate 300 and maintains a cell gap between the first substrate 100 and the second substrate 300. Also, the column spacers 200 may have a single, or triple or more height.

The column spacer 200 is formed of a light shielding material to eliminate the need for separate formation of a black matrix. Specifically, the column spacer 200 is preferably formed of an organic material absorbing light, such as carbon, titanium oxide (TiOx), or a color pigment, or a black organic material, for example, a black resin absorbing light.

Also, the gate pad supplies a scan signal from a gate driver (not shown) to the gate line (not shown). The gate pad includes a gate pad lower electrode 110b connected to the gate line (not shown) and a gate pad upper electrode 180b connected to the gate pad lower electrode 110b via a gate contact hole 180b that passes through the first and second inorganic protective films 150a and 150b and the gate insulating film 120.

Also, the data pad supplies a pixel signal from the data driver (not shown) to the data line DL. The data pad includes a data pad lower electrode 140c connected to the data lines DL, and a data pad upper electrode 180c connected to the data pad lower electrode 140c via a data contact hole 180c that passes through the first and second inorganic protective films 150a and 150b.

The liquid crystal display device according to the present invention includes the thin film transistors, and R, G and B color filters 160a, 160b and 160c formed on the first substrate 100, thus reducing a join margin between the first and second substrates 100 and 300 and improving an aperture ratio. In particular, in the liquid crystal display device according to the present invention, the R, G and B color filters 160a, 160b and 160c reduce a data load between the data lines DL and pixel electrodes 190a, thus removing PAC.

A general liquid crystal display device includes an organic insulating film made of a photo active compound (PAC), formed between the first protective film and the pixel electrode, thus reducing date load between data lines and pixel electrodes. In this regard, PAC is thicker than the inorganic insulating film, thus entailing a long process time and deteriorating yield. Since the PAC and the inorganic insulating film should be patterned through separate mask processes, when a drain contact hole to connect the pixel electrodes and the drain electrode is formed, the overall process is complicated and fabrication costs increase.

However, in the liquid crystal display device according to the present invention, R, G and B color filters 160a, 160b and 160c can reduce a data load between the data lines DL and the pixel electrodes 190a, although the PAC is removed. Furthermore, the R, G and B color filters 160a, 160b and 160c are formed to not overlap the thin film transistors, thereby selectively removing the first and second protective films 150a and 150b stacked in this order simultaneously in the process of exposing the drain electrode of thin film transistors.

Also, an electrostatic emission plate 310 for electrostatic emission is formed on the second substrate 300 that faces the first substrate 100. The electrostatic emission plate 310 is formed of a transparent conductive material such as tin oxide (TO), indium tin oxide (ITO), indium zinc oxide (IZO), or indium tin zinc oxide (ITZO) over the entire surface of the second substrate 300, to dissipate electrostatic charge generated during the module process outside.

That is, the electrostatic emission plate 310 is formed over the entire surface of the second substrate 300 and the second substrate 300 thus does not need a mask process. Accordingly, the second substrate 300 has a small thickness, thus reducing the thickness of the liquid crystal display device.

Hereinafter, with reference to the annexed drawings, a method for fabricating the liquid crystal display device according to the present invention will be described in detail.

FIGS. 4A to 4G are sectional views illustrating a method for fabricating the liquid crystal display device according to the present invention.

Figure 4A:
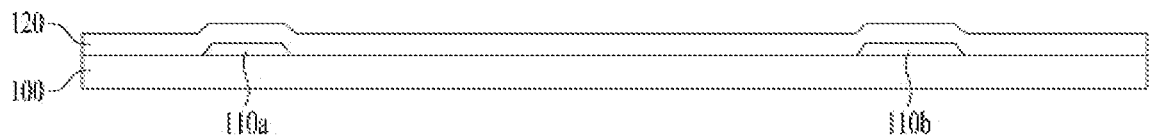
FIGS. 4A to 4G are sectional views illustrating a method for fabricating the liquid crystal display device according to the present invention.

First, as shown in FIG. 4A, a gate electrode 110a, gate lines (not shown) and a gate pad lower electrode 110b are formed using a first mask on a first substrate 100. Specifically, a gate metal layer is formed by a deposition method such as sputtering on the first substrate 100, and the gate metal layer is patterned to form a gate electrode 110a, gate lines (not shown) and a gate pad lower electrode 110b. Also, a gate insulating film 120 is formed over the entire surface of the first substrate 100 including the gate electrode 110a, the gate lines (not shown) and the gate pad lower electrode 110b.

Figure 4B:
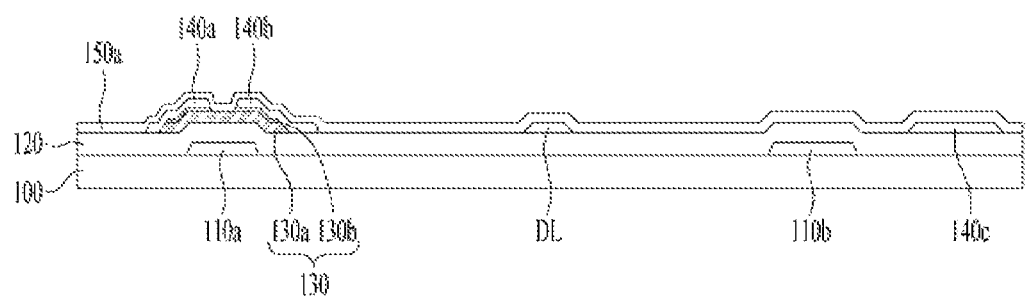

Next, as shown in FIG. 4B, a semiconductor layer 130 including an active layer 130a and an ohmic contact layer 130b stacked in this order is formed using the second mask. Source and drain electrodes 140a and 140b spaced from each other by a predetermined distance are formed on the semiconductor layer 130 using a third mask. At the same time, data lines DL and a data pad lower electrode 140c are formed on the gate insulating film 120 using the third mask. The data lines DL cross gate lines to define a plurality of pixel regions.

In particular, although not shown, when a half tone mask or diffraction exposure mask is used as the second mask, the semiconductor layer 130, the source and drain electrodes 140a and 140b, data lines DL and the data pad lower electrode 140c can be formed using one mask and the manufacturing process can thus be simplified.

Also, although the data pad lower electrode 140c and data lines DL are formed simultaneously, the data pad lower electrode 140c may be formed together with the gate pad lower electrode 110b, and in this case, a configuration to connect the data pad lower electrode 140c to the data lines DL may be further required.

As a result, the thin film transistor including the gate electrode 110a, the semiconductor layer 130, and the source and drain electrodes 140a and 140b is formed. Also, a first inorganic protective film 150a is formed over the entire surface of the gate insulating film 120 including the thin film transistor. The first inorganic protective film 150a is preferably an inorganic insulating film such as SiNx.

Figure 4C:
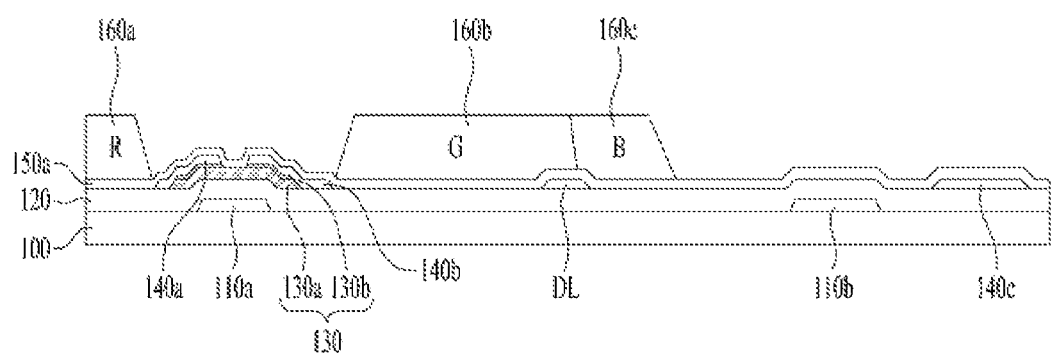
Figure 4D:
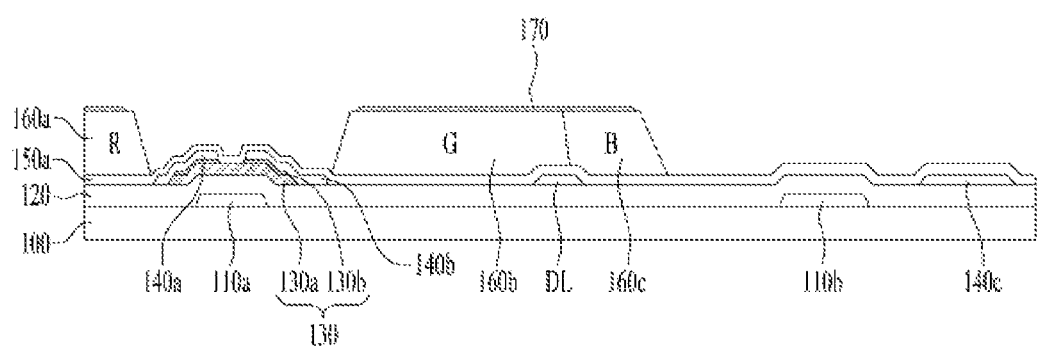

Next, as shown in FIG. 4C, R, G and B color filters 160a, 160b and 160c are formed in pixel regions on the first inorganic protective film 150a using fourth, fifth and sixth masks. As shown in FIG. 4D, a common electrode 170 is formed on the R, G and B color filters 160a, 160b and 160c using a seventh mask. The common electrode 170 is formed as a single electrode shape using a transparent conductive material such as tin oxide (TO), indium tin oxide (ITO), indium zinc oxide (IZO), and indium tin zinc oxide (ITZO).

In particular, preferably, the R, G and B color filters 160a, 160b and 160c are formed in pixel regions excluding thin film transistors, so that the R, G and B color filters 160a, 160b and 160c do not overlap the thin film transistors. This serves to form a drain contact hole 180a to connect the pixel electrodes and the drain electrode 140b using one mask.

Specifically, in accordance with the general liquid crystal display device, first and second protective films are sequentially formed such that they cover the thin film transistors. At this time, the first protective film is formed of an inorganic insulating film and the second protective film is formed of an organic insulating film, as a photo active compound (PAC).

The formation of the second protective film with a photo active compound (PAC) aims at reducing a data load between the pixel electrodes and the data lines.

Since a third protective film is formed of an inorganic insulating film on the second protective film in order to form a fringe field, two mask processes in total are required for formation of a drain contact hole to connect the pixel electrode to the drain electrode.

That is, the first and third protective films are formed of inorganic insulating films, while the second protective film is formed of PAC as an organic insulating film. For this reason, the first, second and third protective films cannot be simultaneously patterned. Accordingly, the general liquid crystal display device has a configuration in which the second protective film is selectively removed to expose the first protective film, a third protective film is formed to cover the first protective film exposed through removal of the second protective film, and the first and third protective films stacked in this order are then selectively removed to expose the drain electrode.

However, as described above, in the liquid crystal display device according to the present invention, R, G and B color filters 160a, 160b and 160c reduce data load between the pixel electrodes and data lines, thus removing PAC. In particular, R, G and B color filters 160a, 160b and 160c are formed in pixel regions, excluding regions where thin film transistors are formed, thereby forming the drain contact hole using one mask.

Figure 4E:
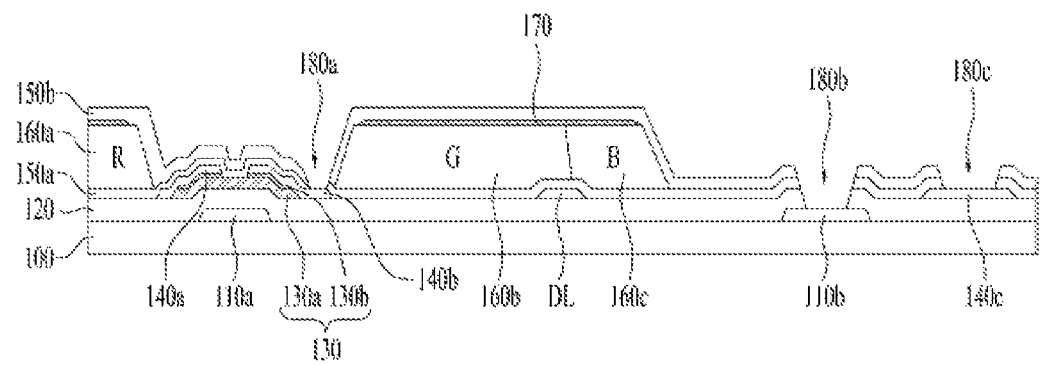

Next, as shown in FIG. 4E, a second inorganic protective film 150b is formed over the entire surface of the first inorganic protective film 150a including the common electrode 170. The second inorganic protective film 150b is also formed of an inorganic insulating film such as SiNx, like the first inorganic protective film 150a. In this case, since only the first inorganic protective film 150a and the second inorganic protective film 150b overlap the thin film transistor, the first and second inorganic protective films 150a and 150b are patterned using an eighth mask to form a drain contact hole 180a exposing the drain electrode 140b. At the same time, a gate pad contact hole 180b and a data pad contact hole 180c exposing the gate pad lower electrode 110b and the data pad lower electrode 140c are formed.

Figure 4F:
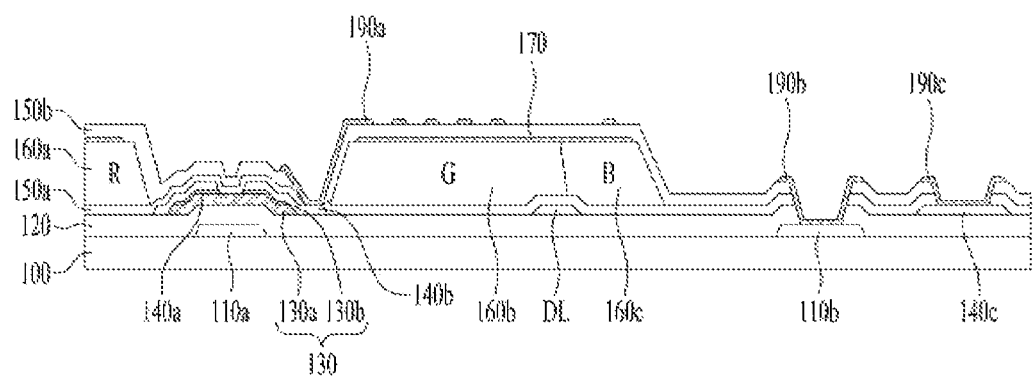

Also, as shown in FIG. 4F, a transparent conductive material such as tin oxide (TO), indium tin oxide (ITO), indium zinc oxide (IZO), and indium tin zinc oxide (ITZO) is deposited over the entire surface of the second inorganic protective film 150b including the drain contact hole 180a, the gate pad contact hole 180b and the data pad contact hole 180c, and is thus patterned using a ninth mask to form pixel electrodes 190a, a gate pad upper electrode 190b and a data pad upper electrode 190c.

At this time, the pixel electrodes 190a are formed to have a shape of a plurality of slits and are connected to the drain electrode 140b through the drain contact hole 180a. The pixel electrodes 190a overlap the common electrode 170 via the second inorganic protective film 150b to form a fringe field. Also, the gate pad upper electrode 190b and the data pad upper electrode 190c are connected through the gate pad contact hole 180b and the data pad contact hole 180c to the gate pad lower electrode 110b and the data pad lower electrode 140c, respectively.

Figure 4G:
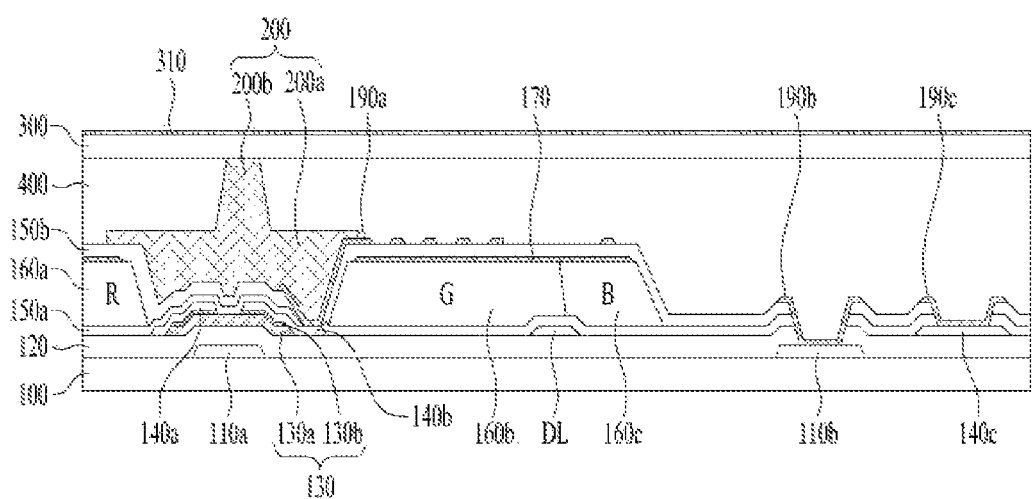

Finally, as shown in FIG. 4G, a column spacer 200 is formed using an eleventh mask such as a half tone mask or a diffraction exposure mask on the second inorganic protective film 150b that overlaps and covers the thin film transistor (S40). At this time, as shown in FIG. 4G, the column spacer 200 may have a double height including: a first pattern 200a serving as PAC that overlaps and covers thin film transistors to compensate heights of the R, G and B color filters 160a, 160b and 160c; and a second pattern 200b formed on the first pattern 200a such that second pattern 200b contacts the second substrate 300 and maintains a cell gap between the first substrate 100 and the second substrate 300.

Also, the column spacer 200 may have a single, or triple or more height, if desired. The column spacer 200 is formed of a light shielding material to eliminate the necessity of a process for forming a black matrix.

Also, the first substrate 100 is joined to the second substrate 300 and a liquid crystal is then injected between the first substrate 100 and the second substrate 300 to form a liquid crystal layer 400. In particular, an electrostatic emission plate 310 for electrostatic emission is formed on the second substrate 300.

The electrostatic emission plate 310 is formed of a transparent conductive material such as tin oxide (TO), indium tin oxide (ITO), indium zinc oxide (IZO), or indium tin zinc oxide (ITZO) over the entire surface of the second substrate 300, to dissipate electrostatic charge generated during the module process outside.

In accordance with the liquid crystal display device according to the present invention, thin film transistors, and R, G and B color filters 160a, 160b and 160c are formed on the first substrate 100 using ten masks in total, thereby reducing fabrication costs and simplifying the overall manufacturing process. Furthermore, when the semiconductor layer 130, the source and drain electrodes 140a and 140b, the data lines DL and the data pad lower electrode 140c are formed using one mask, the liquid crystal display device can be formed using nine masks in total.

In particular, thin film transistors and R, G, B color filters (160a, 160b, 160c) are formed on the first substrate 100, thus reducing a join margin of first and second substrates 100 and 300 and improving an aperture ratio. Also, the R, G and B color filters 160a, 160b and 160c can reduce a data load between data lines DL and pixel electrodes 190a, thus removing a photo active compound (PAC), reducing fabrication costs and decreasing process time. Also, removal of PAC enables formation of the drain contact hole 180a to connect the drain electrode 140b to the pixel electrode 190a using one mask.

The liquid crystal display device and a method for fabricating the same according to the present invention have the following advantages.

First, color filters and thin film transistors are formed on a first substrate, thus reducing a join margin of the first and second substrates and improving an aperture ratio. In particular, the color filters formed on the first substrate reduce a data load between pixel electrodes and data lines, thus decreasing fabrication costs through removal of a photo active compound (PAC).

Second, since the PAC present between a first protective film and pixel electrode is removed, a drain contact hole to connect a drain electrode to a pixel electrode can be formed through one mask process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A liquid crystal display device comprising:
a first substrate having a plurality of pixel regions defined by a plurality of gate lines and a plurality of data lines crossing each other;
a thin film transistor formed in each pixel region;

a first inorganic protective film on the first substrate including the thin film transistor;
color filters formed on the first inorganic protective film in each pixel region excluding the thin film transistor;
a common electrode formed on the color filters;
a second protective film formed over the entire surface of the first inorganic protective film including the common electrode;
a pixel electrode formed on the second inorganic protective film, such that the pixel electrode is connected to a drain electrode through a drain contact hole exposing the drain electrode; and
a column spacer formed on the second inorganic protective film such that the column spacer covers the thin film transistor,
wherein the first inorganic protective film directly contacts the second inorganic protective film at a portion surrounding the drain contact hole.

2. The liquid crystal display device according to claim 1, further comprising a second substrate joined to the first substrate,
wherein an electrostatic emission plate is formed over the entire surface of the second substrate.

3. The liquid crystal display device according to claim 1, wherein the column spacer is formed of a light shielding material.

4. The liquid crystal display device according to claim 3, wherein the light shielding material is at least one selected from carbon, titanium oxide and a color pigment.

5. The liquid crystal display device according to claim 2, wherein the column spacer comprises:
a first pattern covering the thin film transistor, to compensate a height of the color filters; and
a second pattern formed on the first pattern, wherein the second pattern contacts the second substrate and maintains a cell gap between the first substrate and the second substrate.

6. A method for fabricating a liquid crystal display device comprising:
forming a plurality of gate lines and a plurality of data lines crossing each other via a gate insulating film to define pixel regions on a first substrate and forming thin film transistors connected to the gate lines and the data lines;
forming a first inorganic protective film on the first substrate including the thin film transistor;
forming color filters on the first inorganic protective film in each pixel region excluding the thin film transistor;
forming a common electrode on the color filters;
forming a second inorganic protective film on the common electrode, and selectively removing only the first and second inorganic protective film to form a drain contact hole exposing a drain electrode of the thin film transistor;
forming a pixel electrode connected to the drain electrode on the second inorganic protective film; and
forming a column spacer on the second protective film such that the column spacer covers the thin film transistor.

* * * * *